United States Patent [19]

Turner

[11] Patent Number: 4,535,834

[45] Date of Patent: Aug. 20, 1985

[54] METHOD AND APPARATUS FOR CONTROLLING THERMAL TRANSFER IN A CYCLIC VACUUM PROCESSING SYSTEM

[75] Inventor: Norman L. Turner, Gloucester, Mass.

[73] Assignee: Varian Associates, Inc., Palo Alto, Calif.

[21] Appl. No.: 606,051

[22] Filed: May 2, 1984

[51] Int. Cl.³ .............................................. F28F 9/00
[52] U.S. Cl. ..................... 165/80 R; 51/235; 118/730; 118/733; 118/50; 165/86; 165/185; 250/492.3; 269/21; 269/903
[58] Field of Search ............... 165/80 R, 80 A, 80 B, 165/80 C, 80 D, 185, 86; 118/724, 728, 729, 730, 733, 50; 269/26, 21.903; 51/217 L, 235, 324; 250/443.1, 492.1, 492.2, 492.3

[56] References Cited

U.S. PATENT DOCUMENTS

| | | | |
|---|---|---|---|
| 3,566,960 | 8/1969 | Stuart | 204/208 |
| 4,139,051 | 2/1979 | Jones et al. | 165/80 R |
| 4,261,762 | 4/1981 | King | 148/1.5 |
| 4,282,924 | 8/1981 | Faretra | 165/80 C |
| 4,453,080 | 6/1984 | Berkowitz | 250/443.1 |
| 4,457,359 | 7/1984 | Holden | 165/80 C |
| 4,458,746 | 7/1984 | Holden et al. | 165/80 A |
| 4,491,173 | 1/1985 | Demand | 165/86 X |

OTHER PUBLICATIONS

King et al., "Experiments on Gas Cooling of Wafers," Nucl. Instrum. Methods, 189 (1981) pp. 169–173.
Hammer, "Cooling Ion Implantation Target," IBM Technical Disclosure Bulletin, vol. 19, No. 6, Nov. 1976, pp. 2270–2271.
Mack, "Wafer Cooling in Ion Implantation," Ion Implantation: Equipment and Techniques, Proc. Fourth Int. Conf., Sep. 1982, (Springer-Verlag, 1983), pp. 221–233.
Model 80-10 High Current Ion Implantation System Brochure, Varian/Extrion Division, Feb. 1982.

Primary Examiner—Sheldon J. Richter
Attorney, Agent, or Firm—Stanley Z. Cole; William R. McClellan

[57] ABSTRACT

Apparatus for providing thermal transfer between a semiconductor wafer and a heat sink or source in a vacuum processing chamber includes a platen against which the wafer is sealed to define a thermal transfer region therebetween. The platen includes a passage for gas flow between the chamber and the thermal transfer region. The apparatus further includes a valve for controllably opening and closing the passage and a controller for closing the valve when the pressure in the chamber reaches a predetermined value. Gas at the predetermined pressure, typically 0.5 to 100 Torr, is trapped in the thermal transfer region and conducts thermal energy between the workpiece and the platen. In a preferred embodiment, a plurality of platens are positioned on a rotating disc in an ion implantation system and a centrifugally operated valve is utilized to close the passage.

9 Claims, 6 Drawing Figures

METHOD AND APPARATUS FOR CONTROLLING THERMAL TRANSFER IN A CYCLIC VACUUM PROCESSING SYSTEM

BACKGROUND OF THE INVENTION

This invention relates to processing of semiconductor wafers in a vacuum chamber and, more particularly, to methods and apparatus for thermal transfer in an ion implantation system which utilizes gas as a transfer medium.

In the fabrication of integrated circuits, a number of processes have been established which involve the application of high energy beams onto semiconductor wafers in vacuum. These processes include ion implantation, ion beam milling and reactive ion etching. In each instance, a beam of ions is generated in a source and directed with varying degrees of acceleration toward a target. Ion implantation has become a standard technique for introducing impurities into semiconductor wafers. Impurities are introduced into the bulk of semiconductor wafers by using the momentum of energetic ions as a means of imbedding them in the crystalline lattice of the semiconductor material.

As energetic ions impinge on a semiconductor wafer and travel into the bulk, heat is generated by the atomic collisions. This heat can become significant as the energy level or current level of the ion beam is increased and can result in uncontrolled diffusion of impurities beyond prescribed limits. As device geometries become smaller, this uncontrolled diffusion becomes less acceptable. A more severe problem with heating is the degradation of patterned photoresist layers which are applied to semiconductor wafers before processing and which have relatively low melting points.

In commercial semiconductor processing, a major objective is to achieve a high throughput in terms of wafers processed per unit time. One way to achieve high throughput in an ion beam system is to use a relatively high current beam. However, large amounts of heat may be generated in the wafer. Thus, it is necessary to cool the wafer in order to prevent elevated temperatures from being attained.

Techniques for keeping the wafer temperature below a prescribed limit have included batch processing, in which the incident power is spread over a number of wafers, time-shared scanning of the beam and conductive cooling through direct solid-to-solid contact between a wafer and a heat sink. The cooling efficiency of systems employing solid-to-solid contact is limited by the extent to which the backside of the wafer contacts the thermally conductive surface, since, at the microscopic level, only small areas of the two surfaces (typically less than 5%) actually come into contact.

The technique of gas conduction is known to permit thermal coupling between two opposed surfaces and has been applied to semiconductor processing in vacuum. In one approach, gas is introduced into a cavity between a wafer and a support plate. The achievable thermal transfer with this approach, however, is limited, since bowing of the wafer occurs at low gas pressures.

Gas-assisted, solid-to-solid thermal transfer with a semiconductor wafer is disclosed in U.S. Pat. No. 4,457,359 assigned to the assignee of the present application. A semiconductor wafer is clamped at its periphery onto a shaped platen. Gas under pressure is introduced into the microscopic void region between the platen and the wafer. The gas pressure approaches that of the preloading clamping pressure without any appreciable increase in the wafer-to-platen spacing. Since the gas pressure is significantly increased without any increase in the wafer-to-platen gap, the thermal resistance is reduced; and solid-to-solid thermal transfer with gas assistance produces optimum results. In both of these approaches, the gas in supplied from a gas source, including means for regulating the pressure, coupled to the thermal transfer region behind the wafer.

As the demand for higher throughput ion implantation systems increases, it will become necessary to utilize higher currents, thereby, requiring the application of gas cooling to batch systems. Typically, in batch systems, a number of wafers, for example 25, are mounted on a large disc which is rotated during ion implantation. The ion beam can be scanned across the rotating disc or the disc can be translated mechanically during rotation to provide uniform ion dosage over the surface of the wafers.

The use of gas cooling in a batch processing system is complicated by two factors. First, the hardware required to introduce gas into the thermal transfer region behind the wafer must be repeated at each wafer location. This greatly increases the complexity and cost of the system. In addition, connections external to the disc must be made through rotary connections along the axis of rotation. Prior art rotating discs have been water cooled with the cooling water piped to the disc through a rotating seal. The addition of connections for gas cooling would further complicate this arrangement.

It is an object of the present invention to provide novel apparatus for thermal transfer with a semiconductor wafer in vacuum.

It is another object of the present invention to provide novel methods and apparatus for gas conduction thermal transfer with a semiconductor wafer in an ion implantation system.

It is still another object of the present invention to provide novel methods and apparatus for gas conduction thermal transfer in an ion implantation system utilizing a movable support for mounting a plurality of wafers.

It is yet another object of the present invention to provide methods and apparatus for thermal transfer with a semiconductor wafer in a vacuum chamber which is vented during a portion of the processing cycle.

SUMMARY OF THE INVENTION

According to the present invention, these and other objects and advantages are achieved in methods and apparatus for providing thermal transfer between a workpiece and a heat sink or source in a vacuum processing chamber which is vented to atmosphere during one portion of a processing cycle and is vacuum pumped to a low pressure during another portion of the cycle. The apparatus includes a platen against which the workpiece is sealed to define a thermal transfer region therebetween. The platen includes a passage for gas flow between the chamber and the thermal transfer region. The apparatus further includes valve means for controllably opening and closing the passage and control means for closing the valve means when the pressure in the chamber reaches a predetermined intermediate pressure. Gas at the intermediate pressure is trapped in the thermal transfer region during vacuum processing and conducts thermal energy between the workpiece and the platen.

In one embodiment of the invention, a plurality of such platens are positioned on a disc adapted for rotation about a central axis. The valve means associated with each platen, upon rotation of the disc above a predetermined speed, is closed by centrifugal force. The control means includes means for sensing the pressure in the chamber and means for rotating the disc above the predetermined speed when the chamber reaches the intermediate pressure.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
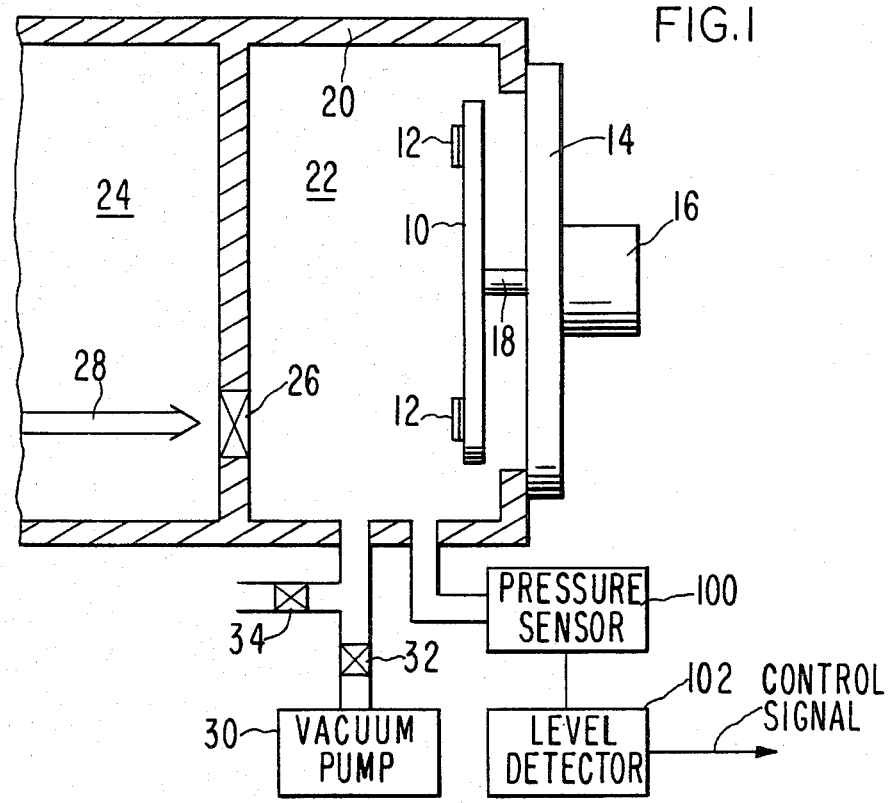
FIG. 1 is a simplified cross-sectional view of a batch processing ion implantation end station.

An end station and the adjacent portion of the beamline for a batch processing ion implantation system are shown in simplified form in FIG. 1. A rotating disc assembly includes a rotating disc 10, a plurality of semiconductor wafers 12 mounted on the disc 10, a chamber door 14 and a drive motor 16 for the rotating disc 10. The rotating disc 10 is connected by a drive shaft 18 through the chamber door 14 to the motor 16. During implantation, the chamber door 14 is sealed to a housing 20 to define an implant chamber 22. The housing 20 also defines a beamline vacuum chamber 24, which can be isolated from the implant chamber 22 by a gate valve 26. An ion beam 28, formed in an ion source and passed through appropriate mass analysis and ion optical elements (not shown), is applied to the wafers 12 through the gate valve 26. A vacuum pump 30 is coupled through an isolation valve 32 to the implant chamber 22. The implant chamber 22 is also coupled through an isolation valve 34 to the external environment for venting purposes. The beamline vacuum chamber 24 is coupled to a vacuum pump (not shown).

In operation, the ion implantation system shown in FIG. 1 processes semiconductor wafers in a cyclic manner. The cycle includes, generally, the placement of wafers in the system followed by ion implantation and then removal of the wafers from the system. More specifically, at the end of one implantation cycle, the gate valve 26 is closed to isolate the beamline vacuum chamber 24; and the implant chamber 22 is vented by closing valve 32 and opening valve 34. This raises the implant chamber 22 to atmospheric pressure. The chamber door 14 is opened, and the wafers 12 are removed and a new set of wafers is placed on the rotating disc 10. The exchange of wafers 12 can be automatic or manual. The chamber door 14 is then sealed to the housing 20. The valve 34 is closed, and the valve 32 to the vacuum pump 30 is opened. Vacuum pumping of the implant chamber 22 proceeds until the desired pressure level is attained. During vacuum pumping of the chamber 22, rotation of the disc is initiated. When a suitable pressure level has been attained, the gate valve 26 is opened; and implantation of the wafers 12 proceeds. In the embodiment shown in FIG. 1, the ion beam 28 is scanned in one dimension over a portion of the rotating disc 10 to assure uniform ion dosage of the wafers 12. In other systems known in the prior art, the ion beam 28 is held stationary; and the rotating disc is reciprocated in one dimension as well as rotated to achieve uniform ion implantation of the wafers. After implantation is completed, the implant chamber 22 is vented, as described above, and the process is repeated.

Figure 2:
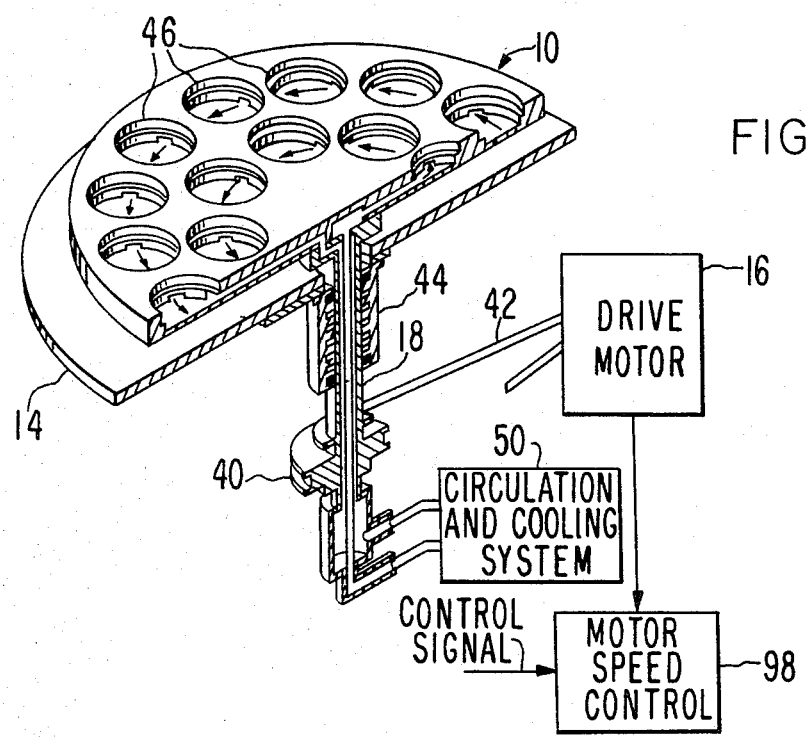
FIG. 2 is a cutaway view of a rotating disc for mounting wafers.

The rotating disc 10 and the chamber door 14 are shown in perspective cutaway view in FIG. 2. The rotating disc 10 is coupled to the drive motor 16 through a pulley 40 atached to the drive shaft 18, and a drive belt 42. The drive shaft 18 passes through a ferrofluidic seal 44 which permits rotary motion to be transmitted into the vacuum region of the implant chamber 22. The rotating disc 10 includes a plurality of wafer clamping locations 46, which are described in detail hereinafter. The rotating disc 10 can optionally be water cooled. When this feature is included, water or other suitable cooling fluid is circulated through internal passages in the disc 10 to each wafer clamping location 46. The passages in the disc are connected to an external circulation and cooling system 50 through concentric passages in the drive shaft 18.

Figure 3A:
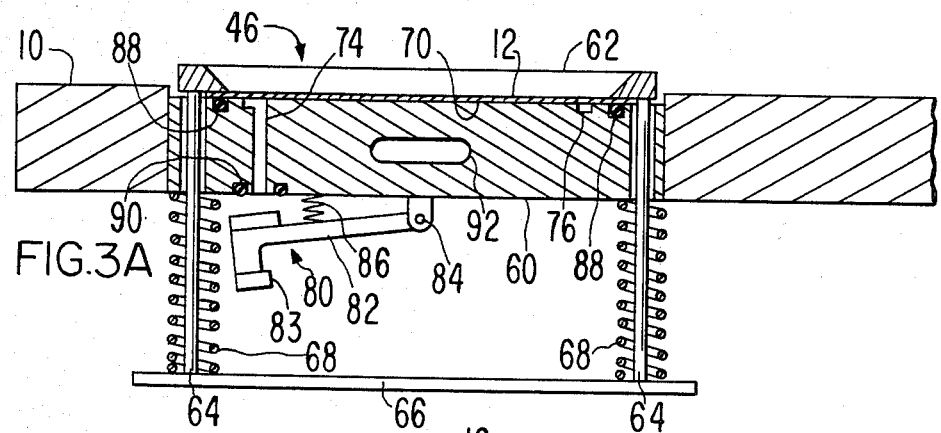
FIGS. 3A and 3B are partial cross-sectional views of a wafer location on the rotating disc shown in FIG. 2.
Figure 3B:
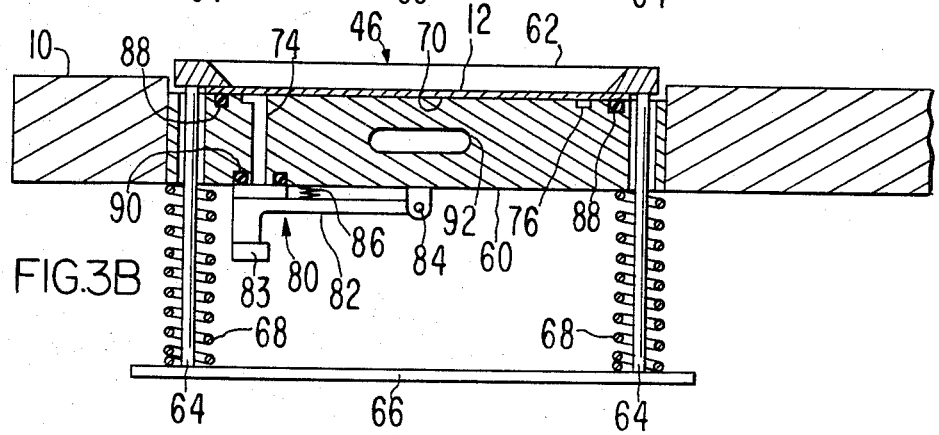

A simplified cross-sectional view of one of the wafer clamping locations 46 on the rotating disc 10 is shown in FIGS. 3A and 3B. Included are a platen 60 mounted to the disc 10 and means for clamping the wafer 12 against the platen 60. The wafer clamping means includes a clamping ring 62, which is adapted to clamp the wafer at is circumferential edge against the platen 60. The clamping ring 62 is coupled by posts 64 through holes in the platen 60 to a plate 66 on the backside of the disc 10. Positioned on the posts 64 between the plate 66 and the backside of the platen 60 are springs 68 which draw the clamping ring 62 against the wafer 12 and firmly clamp it in place. When the wafer 12 is to be removed, a plunger (not shown) pushes the plate 66 upward, thereby compressing the springs 68, and lifts the clamping ring 62. The wafer 12 can be removed manually. Alternatively, it can be lifted by a series of support posts or a vacuum chuck (not shown) for access by an automatic wafer handling system.

A top surface 70 of the platen 60, which faces the backside of the wafer 12, can be flat or can include a cavity in its central portion. Preferably, however, the top surface 70 has a convex contour. The wafer 12 is prestressed by the convex contour and is brought into intimate contact with the top surface 70. Regardless of the contour of the top surface 70, however, the contact between the wafer 12 and the platen 60 on a microscropic scale occurs over no more than 5% of the surface areas. When the microscopic voids between contact points are at high vacuum, little thermal transfer occurs except at the points of actual contact. It is known that the introduction of gas into the region between the wafer 12 and the top surface 70 of the platen 60 enhances thermal transfer. The thermal transfer region can be a cavity, or can be the microscopic voids when the wafer and the platen are in contact. The pressure should be as high as possible without causing bowing of the wafer 12. In the preferred embodiment, in which the wafer 12 is prestressed against the platen 60, this pressure is in the range of about 5 to 100 Torr and, preferably, about 20 to 30 Torr. In other embodiments, the gas pressure can be as low as 0.5 Torr.

In accordance with the present invention, the thermal transfer region between the wafer 12 and the top surface 70 of the platen 60 is connected by a passage 74 to the backside of the rotating disc 10. Thus, there is a direct passage between the thermal transfer region behind the wafer 12 and the implant chamber 22. To insure that the entire thermal transfer region is at about the same pressure, a circumferential groove 76, having a diameter smaller than that of the wafer 12, is provided in the top surface 70 of the platen 60. In a preferred embodiment, the passage 74 is connected to the groove 76. Further included in the platen 60 is a circumferential seal such as an elastomer O-ring 88 positioned on the top surface 70 and having a diameter slightly smaller than the wafer 12. The O-ring 88 seals the thermal transfer region behind the wafer 12 from the implant chamber 22. The platen 60 is shown in FIGS. 3A and 3B with a conduit 92 for the passage of a cooling fluid, such as water.

The apparatus in accordance with the present invention further includes valve means for closing or blocking the passage 74. In the example of FIGS. 3A and 3B, the valve means is a centrifugally operated valve 80. A typical speed of rotation of the disc 10 during ion implantation is 1000 rpm. The centrifugally operated valve 80 is designed to close by the operation of centrifugal force at a predetermined speed which is a fraction, for example 80%, of the final speed of rotation. The valve 80 includes a generally L-shaped member 82, which is pivoted at one end about an axis 84 and has a counterweight 83 attached to the opposite end. The L-shaped member 82 is mounted radially on the backside of the platen 60 such that, upon rotation of the disc 10 above the predetermined speed, centrifugal force acts upon the counterweight 83 and moves the member 82 into a position which blocks the passage 74, as shown in FIG. 3B. The valve 80 further includes a spring 86 which insures that the passage 74 is open when the disc 10 is not rotating. An O-ring 90 seals the passage 74 when the valve 80 is closed.

It will be understood by those skilled in the art that the centrifugally operated valve 80 shown in FIGS. 3A and 3B is but one of many possible embodiments of a centrifugally operated valve. For example, a positive snap action may be desired upon closing of the valve. The counterweight 83 is shown to clearly illustrate the operation of the valve 80. However, the member 82 can have any shape which is adapted for movement by centrifugal force. The spring 86 can be eliminated when the disc 10 is loaded and unloaded in a horizontal position and the force of gravity is sufficient to open the valve.

Means for controlling the operation of the centrifugally operated valve 80 is shown in FIGS. 1 and 2. A pressure sensor 94, such as a diaphragm type is positioned in the implant chamber 22 so as to sense the pressure in the vicinity of the rotating disc 10. The output of the pressure sensor 94 is coupled to a level detector 96 which provides an output signal when the pressure in the implant chamber 22 is below a predetermined level (typically 0.5 to 100 Torr) which is above the final pressure during implantation (typically $1 \times 10^{-5}$ Torr or lower). Referring now to FIG. 2, the output signal from the level detector 96 is applied to a motor speed control 98 which controls the drive motor 16.

The operation of the thermal transfer apparatus in accordance with the present invention is described with reference to FIG. 4A, in which pressure in the implant chamber 22 and in the thermal transfer region behind the wafer 12 are plotted as a function of time. When the chamber door 14 is closed, the vacuum pump 30 begins evacuating the implant chamber 22. At this time, the implant chamber 22 is at atmospheric pressure, or 760 Torr. The disc 10 is not rotating, and the centrifugally operated valve 80 is open. The operation of the vacuum pump 30 causes a reduction in pressure in the implant chamber 22, as indicated by the curve 100 in FIG. 4A. For the present example, it is assumed that the predetermined intermediate pressure in the thermal transfer region behind the wafer 12 is 20 Torr. When the pressure sensor 94 senses a pressure of 20 Torr in the implant chamber 22 at time $t_o$, the level detector 96 provides a control signal to the motor speed control 98 which energizes the drive motor 16 and rotates disc 10. The rotation of the disc 10 causes the valve 80 to be operated to its closed position and seals the passage 74. At this time, the intermediate pressure of 20 Torr is trapped in the thermal transfer region. The vacuum pump 30 continues to operate and causes a further reduction in pressure in the implant chamber 22, as indicated by curve 102 in FIG. 4A. When the implant chamber 22 pressure reaches an appropriate level for ion implantation, for example $1 \times 10^{-5}$ Torr, the gate valve 26 is opened, and ion implantation proceeds. During this time, the disc 10 continues to rotate; and the pressure of 20 Torr is trapped in the thermal transfer region, as indicated by the curve 104 in FIG. 4A.

Figure 4A:
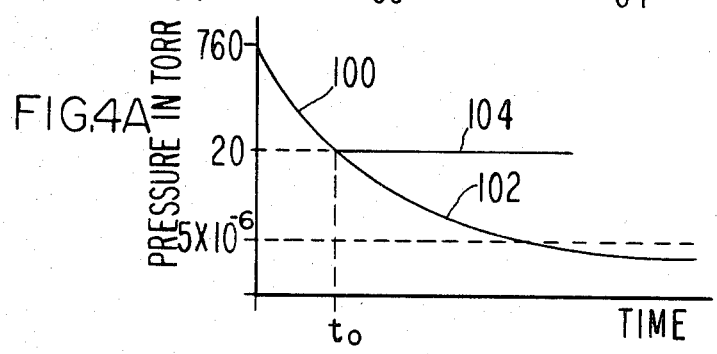
FIGS. 4A and 4B are graphs of pressure as a function of time for alternate modes of operation of the present invention.

In the description of FIG. 4A, possible delays between sensing the predetermined pressure level and the operation of the valve 80 were ignored. The delays are due principally to the time required for the disc 10 to reach the speed required to close the valve 80. This delay can be compensated for or reduced to insure that the desired pressure is trapped in the region behind the wafer 12. In one approach, the disc 10 is rotated at a speed just below that required to operate the valve 80. When the intermediate pressure level is reached, the required speed of the disc 10 can more quickly be attained.

In a second approach, when the vacuum pumping characteristics are predictable, a delay can be built into the operation of the system. For example, assume that the disc 10 requires 20 seconds to reach the speed which closes the valve 80. Assume also that the vacuum pump 30 requires 20 seconds to reduce the pressure level from 60 Torr to 20 Torr. The level detector 96 is then arranged to energize the drive motor 16 when the pressure level reaches 60 Torr. By the time the rotating disc has reached the speed required to operate the valve 80, the pressure in the chamber has been reduced to 20 Torr. In effect, vacuum pumping continues as the speed of rotation of the disc increases.

Figure 4B:
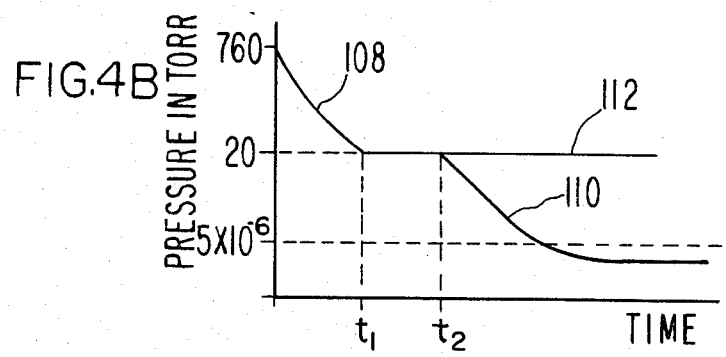

A third approach is illustrated in FIG. 4B. The vacuum pump 30 reduces the pressure in the implant chamber 22 from atmosphere to 20 Torr as indicated by the curve 108. At time $t_1$, vacuum pumping is temporarily stopped, such as by closing the valve 32 and operation of the drive motor 16 is initiated. Vacuum pumping is delayed until time $t_2$ when the rotating disc 10 has reached the speed required to operate the valve 80. At time $t_2$, vacuum pumping continues; and the pressure in the implant chamber 22 is further reduced, as indicated by the curve 110 in FIG. 4B. The pressure of 20 Torr is maintained in the thermal transfer region, as indicated by the curve 112 in FIG. 4B.

Hereinabove, the thermal transfer process has been described as cooling of wafers. It will be understood that the present invention is equally applicable when heating of the wafer by a heated platen is desired. The technique of trapping gas at a predetermined pressure in a thermal transfer region behind a wafer is highly advantageous when applied to a multiple wafer site rotating disc with centrifugally operated valves. However, it will be understood that the technique is applicable to one or more stationary wafer sites when other valve types are utilized. All that is required is that the vacuum processing chamber cycle between atmosphere, or some other relatively high pressure, and a low processing pressure, thereby permitting trapping of an intermediate pressure in the thermal transfer region behind the wafer.

While there has been shown and described what is at present considered the preferred embodiments of the invention, it will be obvious to those skilled in the art that various changes and modifications may be made therein without departing from the scope of the invention as defined by the appended claims.

I claim:

1. In a vacuum processing chamber which is vented during one portion of a processing cycle and is vacuum pumped to a low pressure during another portion of said cycle, apparatus for providing thermal transfer between a workpiece and a heat sink or source comprising:
    a platen against which said workpiece is sealed to define a thermal transfer region therebetween, said platen including a passage for gas flow between said chamber and said thermal transfer region;
    valve means for controllably opening and closing said passage; and
    control means for closing said valve means when the pressure in said chamber reaches a predetermined intermediate pressure,
    whereby gas at said intermediate pressure is trapped in said thermal transfer region during vacuum processing and conducts thermal energy between the workpiece and said platen.

2. Apparatus as defined in claim 1 wherein said control means comprises means for sensing the pressure in said chamber and for providing a control signal when said chamber reaches said intermediate pressure.

3. Apparatus as defined in claim 2 wherein said vacuum processing chamber is an ion implantation chamber.

4. Apparatus as defined in claim 3 further including means for opening said valve means when said chamber is vented.

5. Apparatus as defined in claim 4 wherein said workpiece is a semiconductor wafer.

6. Apparatus for providing thermal transfer with a semiconductor wafer in an ion implantation system including a vacuum chamber which is vented during one portion of an operating cycle and is vacuum pumped to a low pressure during another portion of said cycle, said apparatus comprising:
    a disc adapted for rotation about a central axis and having locations for mounting a plurality of semiconductor wafers, each of said locations including a platen against which a wafer is sealed to define a thermal transfer region, each of said platens including a passage providing gas flow between said thermal transfer region and said chamber, each of said locations further including valve means for controllably opening and closing said passage in said platen; and
    control means for closing each of said valve means when the pressure in said chamber reaches a predetermined intermediate pressure,
    whereby gas at said intermediate pressure is trapped in said thermal transfer region during ion implantation and conducts thermal energy between said wafer and said platen.

7. Apparatus as defined in claim 6 further including means for opening said valve means when said chamber is vented.

8. Apparatus as defined in claim 7 wherein each of said valve means comprises a centrifugally operated valve which closes said passage in said platen through operation of centrifugal force upon rotation of said disc above a predetermined speed and wherein said control means includes means for rotating said disc above said predetermined speed when the pressure in said chamber reaches said intermediate pressure.

9. Apparatus as defined in claim 8 wherein said control means further includes means for sensing the pressure in said chamber and for providing a control signal to said means for rotating said disc when said chamber reaches said intermediate pressure.

* * * * *